(12) United States Patent
Miyazaki et al.

(10) Patent No.: US 8,250,446 B2
(45) Date of Patent: Aug. 21, 2012

(54) DECODER DEVICE AND DECODING METHOD

(75) Inventors: Shunji Miyazaki, Kawasaki (JP);
Kazuhisa Obuchi, Kawasaki (JP);
Junya Mikami, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 1042 days.

(21) Appl. No.: 12/071,903

(22) Filed: Feb. 27, 2008

(65) Prior Publication Data

US 2008/0208939 A1 Aug. 28, 2008

(30) Foreign Application Priority Data

Feb. 28, 2007 (JP) .................................. 2007-49376

(51) Int. Cl.
*G06F 11/00* (2006.01)
(52) U.S. Cl. ....................................................... 714/786
(58) Field of Classification Search .................. 714/752, 714/774, 786, 790, 794
See application file for complete search history.

(56) References Cited

U.S. PATENT DOCUMENTS

| | | | | | |
|---|---|---|---|---|---|
| 4,617,641 | A | * | 10/1986 | Hamada | 708/513 |
| 5,222,189 | A | * | 6/1993 | Fielder | 704/229 |
| 5,321,725 | A | * | 6/1994 | Paik et al. | 375/265 |
| 5,781,586 | A | * | 7/1998 | Tsutsui | 375/241 |
| 6,098,192 | A | * | 8/2000 | Glover | 714/770 |
| 6,754,810 | B2 | * | 6/2004 | Elliott et al. | 712/225 |
| 6,766,489 | B1 | * | 7/2004 | Piret et al. | 714/755 |
| 6,940,428 | B2 | * | 9/2005 | Kajita et al. | 341/50 |
| 7,065,695 | B2 | * | 6/2006 | Cameron et al. | 714/755 |
| 7,882,414 | B2 | * | 2/2011 | Choi et al. | 714/752 |
| 7,941,736 | B2 | * | 5/2011 | Park et al. | 714/800 |
| 7,954,033 | B2 | * | 5/2011 | Hong et al. | 714/755 |
| 2008/0059862 | A1 | * | 3/2008 | Kyung et al. | 714/752 |

OTHER PUBLICATIONS

Communication from European Patent Office dated Jul. 4, 2008, including Extended European Search Report with written Abstract to the European Search Report for corresponding European Patent Application No. 08101922.6, dated Jun. 26, 2008.
3GPP TS 25.212 V7.3.0; 3rd Generation Partnership Project; Technical Specification Group Radio Access Network; Multiplexing and channel coding (FDD)(Release 7); (Dec. 2006).
C. Berrou, A. Glavieux and Punya Thitimajshima, "Near Shannon limit error-correcting coding and decoding: Turbo-codes (1)," in proc. of the IEEE int.conf. on Communications (ICC'93), Geneva, 1993, pp. 1064-1070.
J. Vogt and A. Finger, "Improving the max-log-MAP turbo decoder," Electronics Letters Nov. 9, 2000, vol. 36, No. 23, pp. 1937-1939.

(Continued)

*Primary Examiner* — Marc Duncan
(74) *Attorney, Agent, or Firm* — Myers Wolin, LLC

(57) ABSTRACT

A decoder having an element decoding unit generating external information for input data, including an exponent position determining unit, when the external information output from the element decoding unit is input, of information excluding a sign bit from the external information, specifying an exponent that is a bit position where a value different from a sign bit first appears, a mantissa obtaining unit obtaining information of 1-bit or a plurality of bits in a position next to the exponent as a mantissa out of the external information, a storage unit storing the exponent and the mantissa and a restoring unit restoring the external information by reading the exponent and the mantissa stored in the storage unit, wherein the element decoding unit performs iteration decoding based on the restored external information is utilized.

19 Claims, 27 Drawing Sheets

OTHER PUBLICATIONS

J. Vogt, J.Ertel and A. Finger, "Reducing bit width of ext rinsic memory in turbo decoder realizations," Electronics Letters Nov. 28, 2000, vol. 36, No. 20, pp. 1937-1939.

D.Garrett, B. Xu, and C. Nicol, "Energy Efficient Turbo Decoding for 3G Mobile," in Int. Symp. on Low Power Electronics and Design, 2001; pp. 328-333.

* cited by examiner

FIG. 20

| Result of 1-bit mantissa field adding method | Index |
|---|---|
| 00 0000 0000 | 0 |
| 00 0000 0001 | 1 |
| 00 0000 0010 | 2 |
| 00 0000 0100 | 3 |
| 00 0000 1000 | 4 |
| 00 0001 0000 | 5 |
| 00 0010 0000 | 6 |
| 00 0100 0000 | 7 |
| 00 1000 0000 | 8 |
| 01 0000 0000 | 9 |
| 00 0000 1100 | 10 |
| 00 0001 1000 | 11 |
| 00 0011 0000 | 12 |
| 00 0110 0000 | 13 |
| 00 1100 0000 | 14 |
| 01 1000 0000 | 15 |

| Result of 1-bit mantissa field adding method | Index |
|---|---|
| 00 0000 0000 | 0 |
| 00 0000 0001 | 1 |
| 00 0000 0010 | 2 |
| 00 0000 0100 | 3 |
| 00 0000 1000 | 4 |
| 00 0001 0000 | 5 |
| 00 0010 0000 | 6 |
| 00 0100 0000 | 7 |
| 00 1000 0000 | 8 |
| 01 0000 0000 | 9 |
| 01 1000 0000 | 10 |
| 00 1100 0000 | 11 |
| 01 1100 0000 | 12 |
| 00 0110 0000 | 13 |
| 00 1110 0000 | 14 |
| 01 1110 0000 | 15 |

432

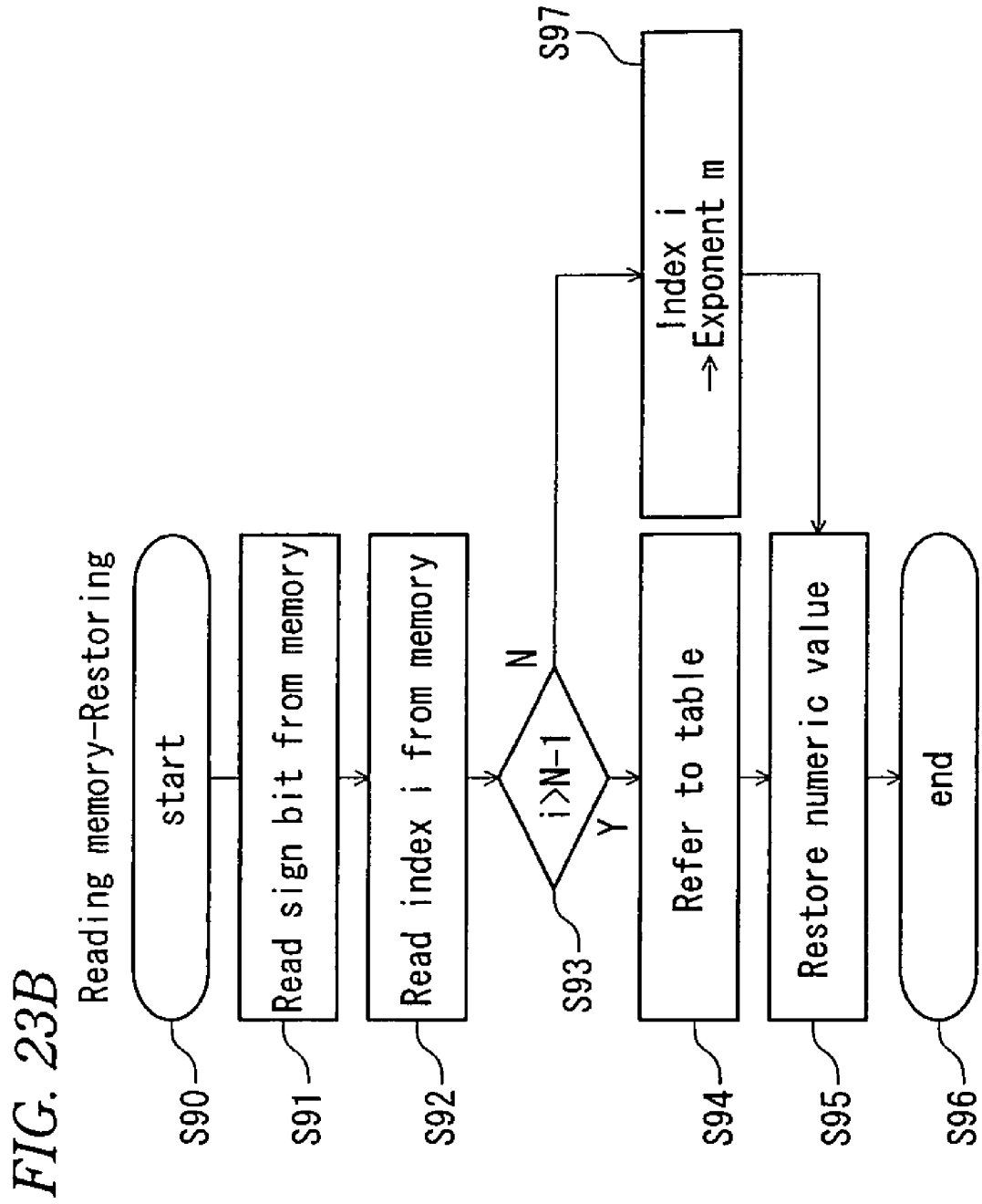

DECODER DEVICE AND DECODING METHOD

CROSS-REFERENCE TO RELATED APPLICATIONS

This application is related to and claims priority to Japanese Application No. 2007-49376 filed Feb. 28, 2007 in the Japanese Patent Office, the contents of which are incorporated by reference herein.

BACKGROUND

1. Field of the Invention

The present invention relates to a decoder device performing iteration decoding and a decoding method.

2. Description of the Related Art

There are a turbo code and a LDPC (Low density Parity Check) code that are error correction codes used in data transfer. The turbo code is explained as an example. FIG. 1 is a configuration example of a turbo encoder 200 (e.g., 3GPP Technical Specification TS25.212). FIG. 2 is a diagram showing a configuration example of a turbo decoder 400 (e.g., C. Berrou, A. Glavieux, and P. Thitimajshima, "Near Shannon limit error-correcting coding and decoding: Turbo-codes (1)," in proc. of the IEEE int. conf. on Communications (ICC'93), Geneva, 1993, pp. 1064-1070).

The turbo encoder 200 includes, as shown in FIG. 1, a first element encoder 210, a second element encoder 230 and an interleaver 220. Information bits are input to the turbo encoder 200 and are encoded by the first element encoder 210 to generate first parity bits. Also, the input information bits are input to the interleaver 220 and are interleaved by the interleaver 220. The interleaved bits are input to the second element encoder 230 and are encoded to generate second parity bits. Further, the information bits themselves are output as systematic bits. Then, for example, these three kinds of bits are combined to form serial bits which are modulated for transmission.

The turbo decoder 400 includes, as shown in FIG. 2, a first element decoder 410, a second element decoder 420, an interleaver 411 and a deinterleaver 421. A demodulated receiving likelihood data is input to the turbo decoder 400 (ys corresponding to the systematic bits, yp 1 and yp 2 respectively corresponding to the two parity bits). The likelihood ys corresponding to the systematic bits, the likelihood yp 1 corresponding to the first parity bits and an external information L'e (2) are input to the first element decoder 410, and an external information Le (1) is output. The output Le (1) and the likelihood ys corresponding to the systematic bits are input to the interleaver 411, and then output respectively after the bits are interleaved. The reason why there is the interleaver 411 is that the second parity bit is interleaved by the interleaver 220 at the time of decoding, which has to correspond to the processing at the time of encoding. The likelihood ys corresponding to the systematic bits whose bits are interleaved, the external information L'e (1) and the likelihood ys 2 corresponding to the second parity bits are input to the second element decoder 420, and an external information Le (2) is output. The external information Le (2) is interleaved to the likelihood of an original string by the deinterleaver 421, and is output as the external information L'e (2). By repeating this process, a decoding bit uj is output from the deinterleaver 421. An error rate characteristic of the decoding bit uj is improved because of this iterative process.

FIG. 3 is a diagram showing a configuration example of the first element decoder 410, the second element decoder 420 of the turbo decoder 400 and the surrounding part (e.g., J. Vogt and A. Finger, "Improving the max-log-MAP turbo decoder," Electronics Letters 9 Nov. 2000, Vol. 36, No. 23, pp. 1937-1939). Each of the element decoders 410 and 420 includes a MAP computing unit 415 and adding units 416 and 417. In the MAP computing unit 415, a posteriori probability is generated by a MAP (Maximum a Posteriori) calculation. In view of circuit size, the likelihood obtained by taking a log of the value of the probability is input to the MAP computing unit 415 as shown for a log-MAP calculation. In the adding unit 417, a prior (probability) likelihood is reduced from the generated posteriori likelihood (ys+L'e) and the external information (return posteriori) is output.

On the other hand, there is a problem that, in general, the amount of the log-MAP calculation of the MAP computing unit 415 is large. Therefore, conventionally, there has been a calculation method called a Max-log-MAP calculation approaching the log-MAP calculation. The Max-log-MAP calculation is a method approximating a "sum of exponent functions of likelihood", the most major calculation element, by the maximum value of each section of the sum. There was a problem that although such calculation could significantly reduce the amount of the processing for the Max-log-MAP calculation, the error rate characteristic was degraded.

Conventionally, as shown in FIG. 3, for return likelihood (external information) after the log-MAP calculation, a coefficient scaling unit 430 has a method for multiplying a number which is smaller than "1" (e.g., J. Vogt and A. Finger, "Improving the max-log-MAP, turbo decoder," Electronics Letters 9 Nov. 2000, Vol. 36, No. 23, pp. 1937-1939. Hereinafter, this method is referred to as "coefficient scaling".) It is known that the error rate characteristic is improved by this method. In general, a scaling value "0.75" is used in view of a circuit implementation.

Also, there has been a method called "indexation" as a method for improving the error rate characteristic for the log-MAP calculation (e.g., J. Vogt, J. Ertel and A. Finger, "Reducing bit width of extrinsic memory in turbo decoder realisations," Electronics Letters 28 Nov. 2000, Vol. 36, No. 20, pp. 1937-1939 and D. Garrett, B. Xu, and C. Nicol, "Energy Efficient Turbo Decoding for 3G Mobile," in Int. Symp. on Low Power Electronics and Design, 2001 pp. 328-333). FIG. 4 is a diagram showing a configuration example of the method. An output side of the element decoders 410 and 420 (the return likelihood (external information) after the log-MAP calculation) is provided with an indexing unit 440, a memory storage unit 441 and a restoring unit 442.

FIG. 5 is a diagram showing an example of the processing performed from the exponent position determining unit 440 to the restoring unit 442. FIG. 6 is a diagram showing a detailed configuration example of processing performed from the exponent position determining unit 440 to the restoring unit 442. The "indexation" obtains a bit position (hereinafter referred to as an "exponent") where a bit other than a sign bit is found first in the likelihood by searching the bits from the sign bit to the end bit (exponent=1) in order to scale down the number of bits N per data, and this exponent is stored in the memory 441, wherein, for example, positive or negative two's complement numbers are applied. Then, the exponent is read to be restored by the restoring unit 442.

For example, as shown in FIG. 5, when "209" in a decimal number is output as the external information (return likelihood), an exponent "8" is obtained in exponent position determining unit 440. Then, the value "8" is stored in the memory 441. Later, the restoring unit 442 restores the external information (restoring value) "0010000000" ("128" in a decimal number) from the storing value which is read from the memory 441. At this time, the output is "128" for the input "209". The value which is "0.612" times as much as the input is output for the input. In this way, the calculation by "indexation" can reduce the number of bits N per data.

There is the following problem of the calculation by "coefficient scaling" and "indexation" for the return likelihood (external information) computed by the MAX-log-MAP calculation.

In "coefficient scaling", the scale down rate per data is constant because a certain coefficient value is multiplied. However, "indexation" obtains the value of the rate, which varies according to the value of the return likelihood. Therefore, although the error rate characteristic of "coefficient scaling" is improved more, a buffer size for storing the return likelihood of the "coefficient scaling" is larger than that of "indexation".

Also, coefficient values used for "coefficient scaling" and "indexation" depend on the encoding rate and the modulation method. For example, if encoding is performed by a modulation method such as BPSK or QPSK when the encoding rate=⅓, when "coefficient scaling" and "indexation" using the coefficient value "0.75" are applied to the other modulation method (particularly, a high encoding rate such as 0.8 and the like) and another modulation method (16QAM or the like), degradation of the error rate characteristic occurs.

Further, in "indexation", there may be a waste of memory when information is not assigned to the exponent. For example, for the numeric value of the bit number N per data ("10" in the above-described example), a number of bits n necessary for storing the exponent is n=[log 2 (N)] (n=[3,3 . . . ]=4 in the above-described example), and the information is not assigned to the numeric value of a number of k=2n□N (k="6" in the above described example) for positive and negative, respectively.

Further, there is a problem that if the number of bits of the prior likelihood, which is the data input to the turbo decoder 400, is large, the size of a storage buffer necessary for the calculation becomes larger.

Further, as a result of "indexation", the value of the external information can be reduced and the error rate characteristic can be improved. However, the value is different from the actual value because the value is an approximate value. Degradation of the characteristic occurs due to the approximation such as in case a level of the average numeric value is kept unchanged.

SUMMARY

In view of the above-described problems, described examples of a decoder device and a decoding method reduce degradation of an error rate characteristic, reduce a waste in the memory, or reduce degradation of the error rate characteristic caused by approximation.

For example, a decoder including an element decoding unit generating external information for input data, including an exponent position determining unit, when the external information output from the element decoding unit is input, of information excluding a sign bit from the external information, specifying an exponent that is a bit position where a value different from a sign bit first appears, a mantissa obtaining unit obtaining information of 1-bit or a plurality of bits in a position next to the exponent as a mantissa out of the external information, a storage unit storing the exponent and the mantissa and a restoring unit restoring the external information by reading the exponent and the mantissa stored in the storage unit, wherein the element decoding unit performs iteration decoding based on the restored external information is utilized.

BRIEF DESCRIPTION OF THE DRAWINGS

FIG. 20 is a diagram showing an example of a table.
FIG. 21 is a diagram showing an example of a table.
FIG. 23A is a flow chart of memory storing processing and FIG. 23B is a flow chart of memory reading processing.

DETAILED DESCRIPTION OF THE PREFERRED EMBODIMENTS

Examples of encoding and decoding using a turbo coding are explained below with reference to the accompanying drawings.

Example 1

Figure 2:
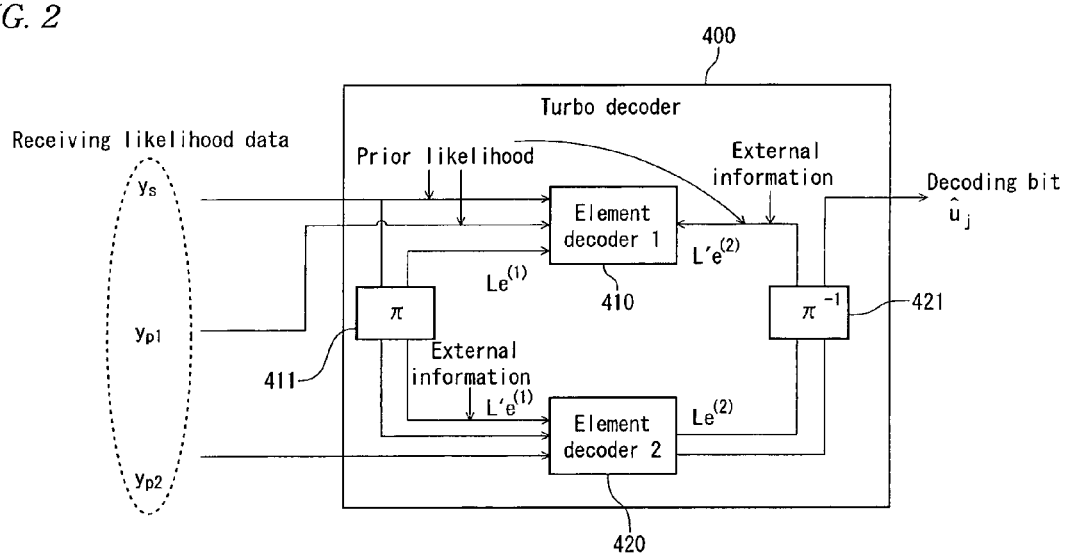
FIG. 2 is a diagram showing a configuration example of a turbo decoder.
Figure 3:
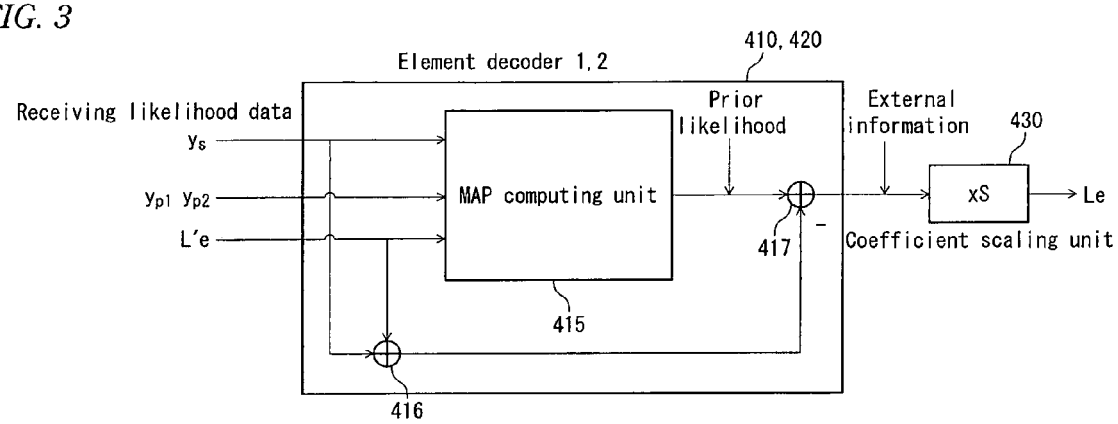
FIG. 3 is a diagram showing a configuration example of an element decoder and a surrounding part.
Figure 4:
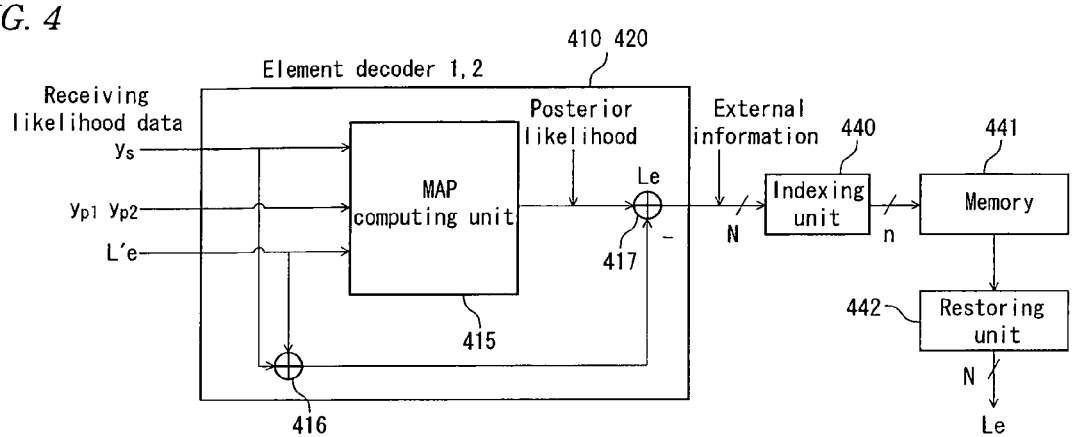
FIG. 4 is a diagram showing a configuration example of an element decoder and a surrounding part.
Figure 5:
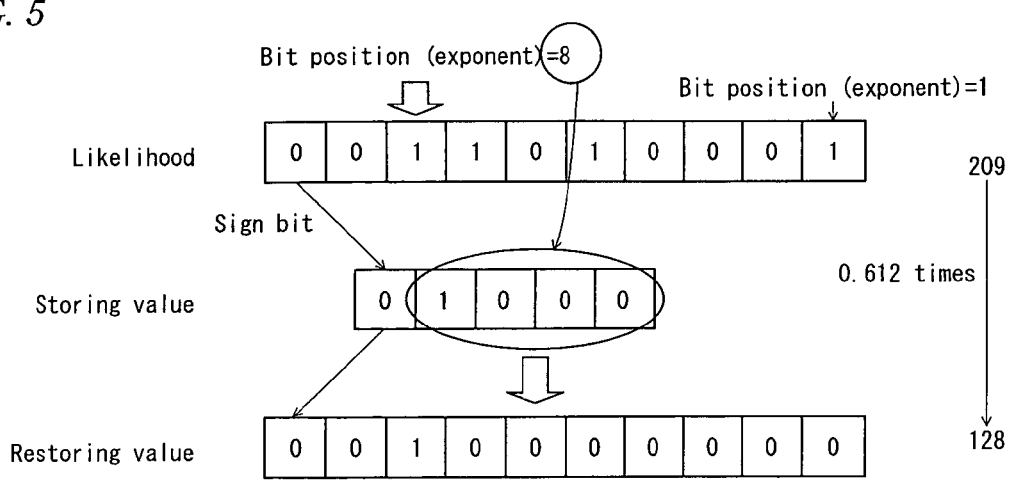
FIG. 5 is a diagram illustrating an example of processing according to the conventional technology.
Figure 6:
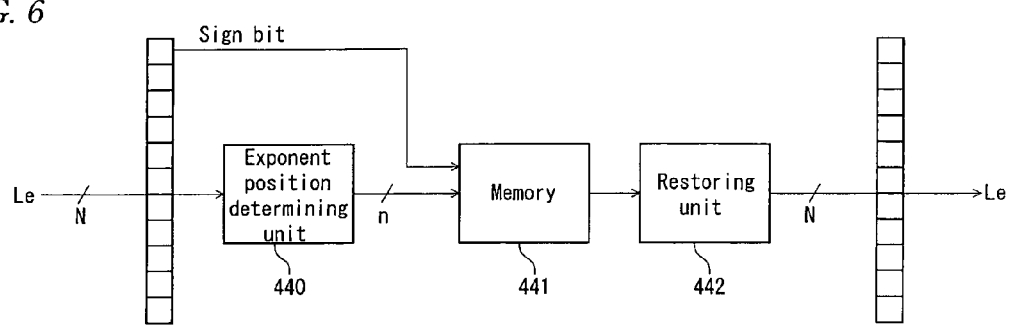
FIG. 6 is a diagram showing a surrounding part of an element decoder.
Figure 7:
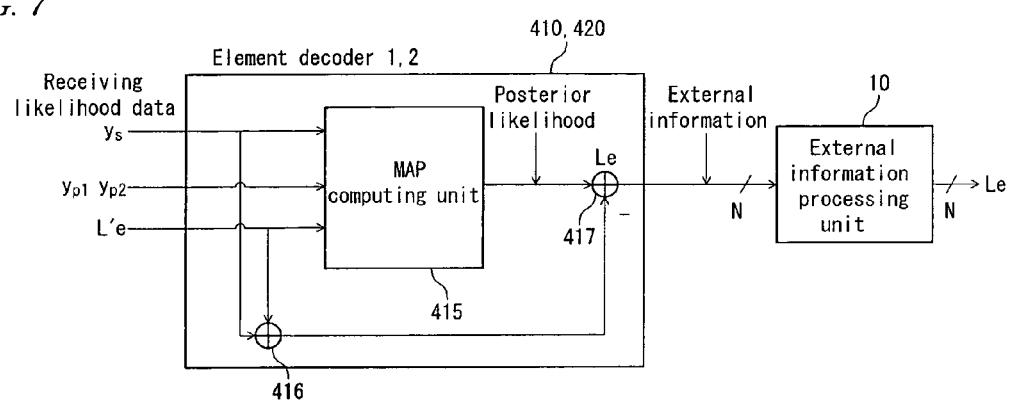
FIG. 7 is a diagram showing a configuration example of an element decoder and a surrounding part.

FIG. 7 is a diagram showing a example of element decoders 410 and 420 of a turbo decoder and the surrounding part to be used in the turbo decoder shown in FIG. 2.

As shown in FIG. 7, the turbo decoder 400 includes an external information processing unit 10 in an output stage of the element decoders 410 and 420. The external information processing unit 10 performs various calculating processing for external information (return likelihood) and outputs the external information after the calculation to the element decoders 420 or 410.

Figure 8:
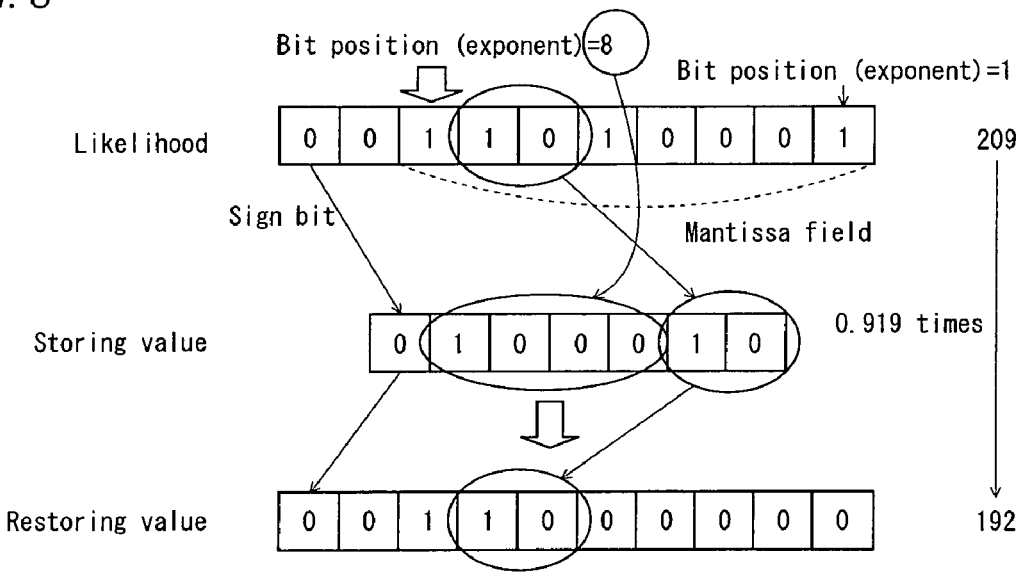
FIG. 8 is a diagram illustrating an example of processing.
Figure 9:
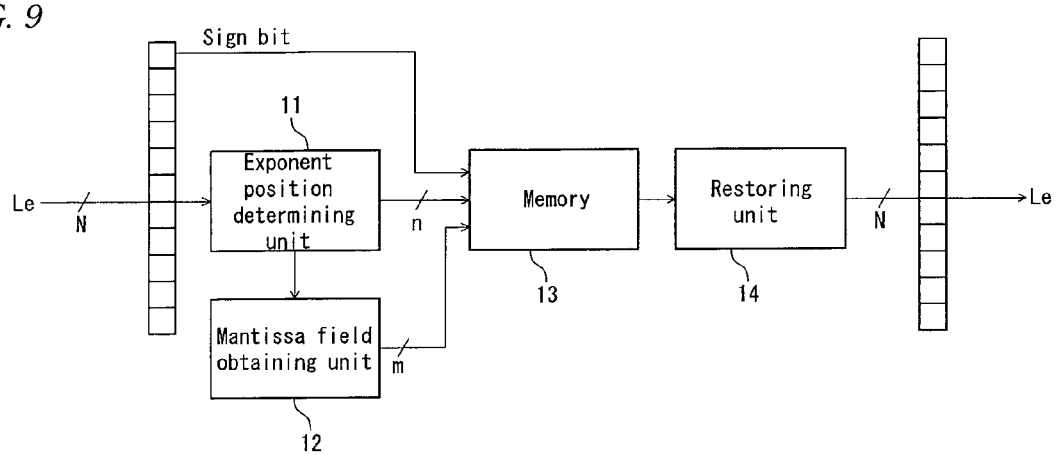
FIG. 9 is a diagram showing a configuration example of an external information processing unit.

FIG. 9 shows a configuration example of the external information processing unit 10 according to example 1. FIG. 8 is a diagram illustrating an example of the processing.

An example of the processing according to example 1 is explained by using FIG. 8. First, "209" (in a decimal number) is input as an example of the external information. The sign bit "0" of the input external information is stored in the memory as it is. Then, a bit position (hereinafter referred to as "exponent"), where the bit "1" different from the sign bit "0" first appears, is specified in order of the bit in the position next to the sign bit. In the example of FIG. 8, the exponent is "8". The value "1000" expressing the exponent "8" in a binary number is stored in the memory.

Further, in the present example 1, information of 2-bits in a position next to the bit position of the exponent is stored in the memory as a mantissa. In the example of FIG. 8, "10" (binary number) is stored. Then, at the time of restoration, the value of the mantissa field is added to the exponent to restore the value. In the example of FIG. 8, "1" is set in the "8"th bit for the exponent field "1000", and also the mantissa field "10" is added to the 7th bit and the 6th bit.

In this way, the restored value is expressed "192" in a decimal number, and the ratio of the output to the input is "0.919". Although the ratio varies according to the value of the input external information, the average ratio is slightly larger than "0.7".

For example, since the ratio becomes larger as compared to the conventional technology, the error rate characteristic is improved, and the method of example 1 is particularly effective when the encoding rate is large (e.g., when the encoding rate is larger than R=⅓).

FIG. 9 is a diagram showing a configuration example of the external information processing unit 10 according to example 1. The external information processing unit 10 includes an exponent position determining unit 11, a mantissa field obtaining unit 12, a memory 13 and a restoring unit 14.

The exponent position determining unit 11 determines the position (exponent) where the bit different from the sign bit first appears for the external information excluding the sign bit. The determined exponent is output to the memory 13 to be stored.

The mantissa field obtaining unit 12 obtains 2-(or 1 or multiple bits) bits of information (mantissa) in the position next to the exponent position for the external information excluding the sign bit. The obtained information is output to the memory 13 as the mantissa to be stored in the memory.

The memory 13 stores the information of the exponent field, the mantissa field and the sign bit in the memory.

The restoring unit 14 reads the sign bit, the values of the exponent and the mantissa from the memory storage unit 13, respectively, in order to restore the external information. The restored external information is input as prior likelihood to the element decoders 420 and 410 as follows.

Figure 10A:
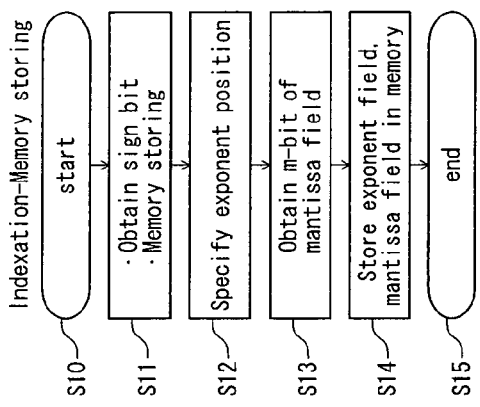
FIG. 10A is a flow chart of memory storing processing and FIG. 10B is a flow chart of memory reading processing.

FIG. 10A is an example of a flow chart showing the processing according to example 1.

When the present processing is started (Step 10), the sign bit of the input external information is stored in the memory 13 (Step 11). The sign bit can be obtained in, for example, the exponent position determining unit 11.

Next, the exponent position determining unit 11 specifies the exponent position (Step 12), and the mantissa field obtaining unit 12 obtains m-bits of the mantissa field (m=2 in the example of FIG. 2) (Step 13).

Then, the values of the exponent field and the mantissa field are stored in the memory storage unit 13 (Step 14), and the processing for memory storing is finished (Step 15).

Figure 10B:
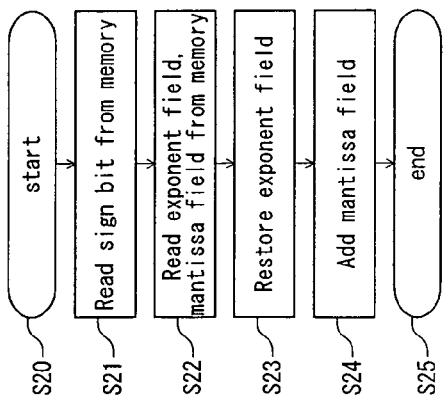

If the memory reading processing shown in FIG. 10B is started (Step 20), the restoring unit 14 reads the sign bit from the memory 13 (Step 21), and also reads the values of the exponent and the mantissa (Step 22).

Next, the restoring unit 14 first restores the exponent (Step 23) then adds the mantissa to the exponent for restoring (Step 24), and finishes the processing (Step 25).

The present example 1 explained that the bit number obtained as the exponent field is "2". However, bit number "1", "3" or the like is applicable.

In this way in the present example 1, for the input external information, not only the information of the exponent but also the information of the mantissa is stored to be restored. Thus, it is possible to improve the error rate characteristic without much increase in the memory size as compared with the conventional case where only the information of the exponent is stored.

Example 2

Figure 11:
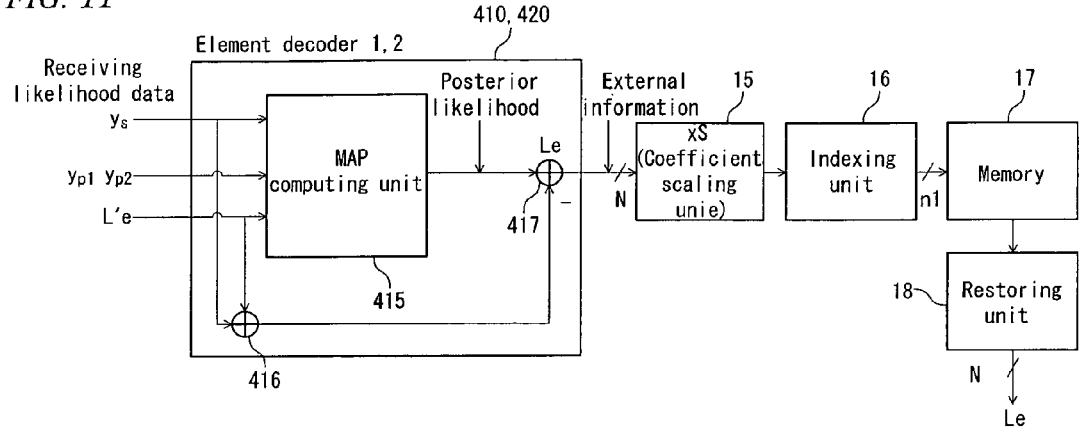
FIG. 11 is a diagram showing another configuration example of an element decoder and a surrounding part.

Next, an example 2 is explained. FIG. 11 is a diagram showing a configuration example of the surrounding part of the element decoders 410 and 420 according to the present example 2. The other configuration is the similar to that of example 1.

As shown in FIG. 11, a coefficient scaling unit 15, an indexing unit 16, memory 17 and a restoring unit 18 are provided for the output (external information) output from the element decoders 410 and 420. The external information processing unit 10 of FIG. 7 corresponds to the coefficient scaling unit 15 through the restoring unit 18.

The coefficient scaling unit 15 multiplies the external information by a certain coefficient (a value which is smaller than "1"), and outputs the multiplied external information.

The indexing unit 16 specifies the exponent position in accordance with the multiplied external information, and outputs the exponent to the memory 17.

The memory 17 stores the value of the exponent and the sign bit in the memory. The sign bit is obtained in the indexing unit 16.

The restoring unit 18 reads the sign bit and the exponent from the memory storage unit 17 to restore the external information. The restored external information is input as a prior likelihood to the element decoders 420 or 410 for the further decoding process.

In this way in the present example 2, the indexation is performed by the indexing unit 16 for the output that is output from the coefficient scaling unit 15. It is possible to improve the problem that the memory size has to be increased by the "coefficient scaling" because the memory size can be reduced by the "indexation". It is also possible to improve the problem that degradation of the error rate characteristic is caused by the "indexation" because the degradation can be improved by the "coefficient scaling".

In the present example 2, in the indexing unit 16, the indexation method for adding the "mantissa field" according to example 1 can be performed in the same way.

Example 3

Figure 12:
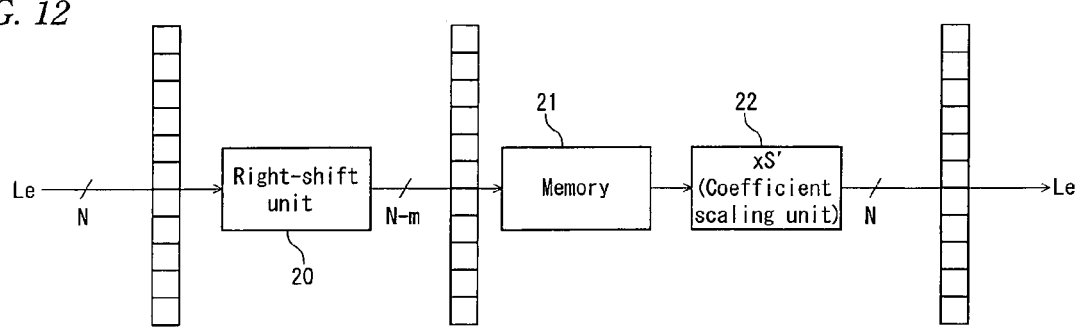
FIG. 12 is a diagram showing another configuration example of an external information processing unit.
Figure 13:
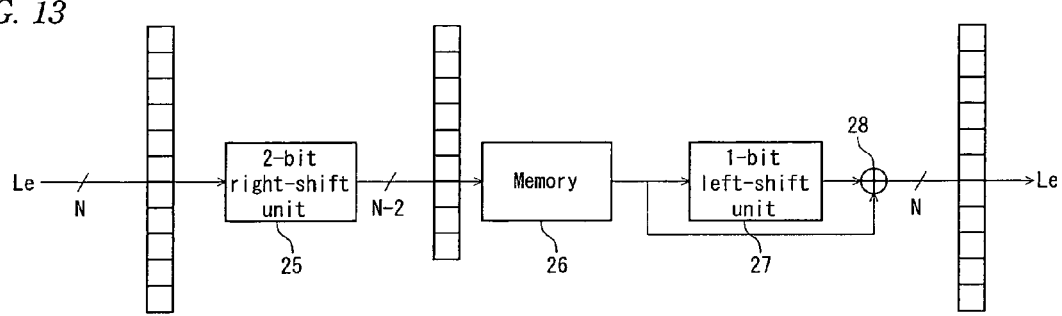
FIG. 13 is a diagram showing another configuration example of an external information processing unit.

Next, an example 3 is explained. FIG. 12 and FIG. 13 are diagrams showing a configuration example of the external information processing unit 10 according to the present example 3. The other configuration is the same as that of example 1.

As shown in FIG. 12, the external information processing unit 10 includes a right-shift unit 20, a memory 21 and a coefficient scaling unit 22.

The right-shift unit 20 performs a shift calculation of m-bits towards the right side for external information Le of N-bits, and the memory storage unit 21 stores (N□m) bits in the memory.

The coefficient scaling unit 22 multiplies the external information of (N□m) bits which is read by the memory storage unit 21 by the coefficient value and outputs the external information of a prescribed scaling value.

FIG. 13 is a diagram showing a configuration example of the external information processing unit 10 in case an overall scaling value is "0.75". The external information processing unit 10 includes a 2-bit right-shift unit 25, a memory 26, a 1-bit left-shift unit 27 and an adding unit 28.

For the input external information Le of N-bits, the 2-bit right-shift unit 25 reduces the number of bits to the number of (N×2) bits by shifting 2 bits to the right. The information which is ¼ (=½^2) times as much as the external information Le is obtained by shifting 2 bits for the external information of N-bits. Then, a buffer size can be reduced by storing the obtained information in the memory of the memory storage unit 26.

Then, the stored external information is read by the 1-bit left-shift unit 27 to be shifted to the left side (twofold). The adding unit 28 adds this output value to the external information output from the memory 26. The external information stored in the memory is multiplied by the three times coefficient value by the 1-bit left-shift unit 27 (twofold) and the adding unit 28. Therefore, for the input external information Le of N-bits, this achieves (¼)×Le×3×(¾)×Le, and "0.75" times which is the predetermined scaling value, In this way, by the method of the "coefficient scaling" according to the present example, the memory size can be reduced by combining a shift circuit and an adder for input external information of N-bits as well as avoiding degradation of the error rate characteristic by the "coefficient scaling". Also, an actual implement is easy because the circuit can be implemented by using the shift circuit and the adder.

In the present example 3, as shown in FIG. 13, the case of achieving the coefficient scaling of "0.75" times was explained. However, a circuit of the other value can be easily achieved by combining the shift circuit and the adder circuit.

Example 4

Next, an example 4 is explained. The present example 4 is an example for determining the appropriate indexation method based on the encoding rate and the modulation method.

Figure 14:
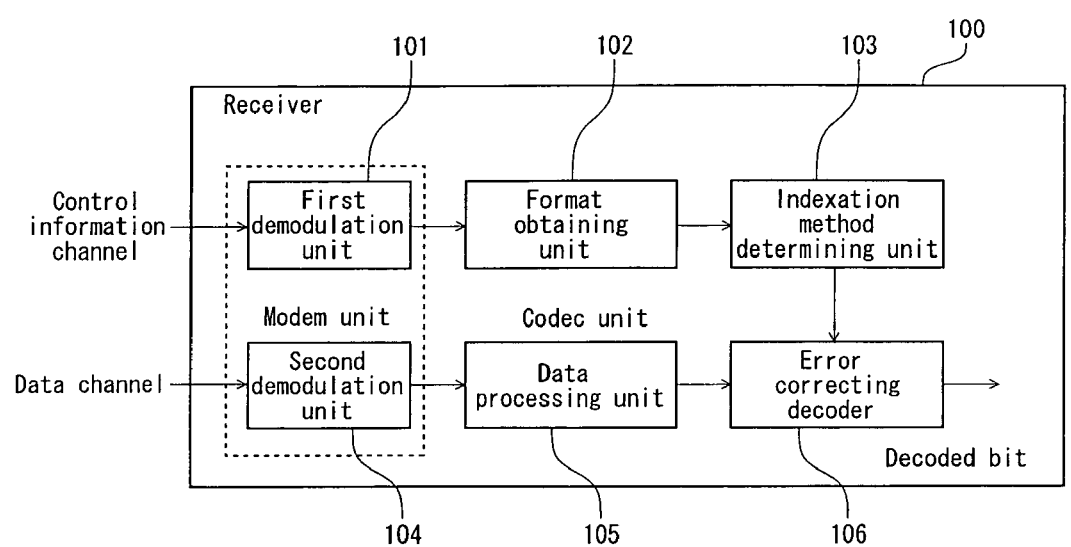
FIG. 14 is a diagram showing a configuration example of a receiver.

FIG. 14 is a diagram showing a configuration example of a receiver 100 according to the present example 4. The receiver 100 is, for example, a receiver in a 3GPP mobile communication system.

The receiver 100 includes a first demodulation unit 101 and a second demodulation unit 104, a format obtaining unit 102, an indexation method determining unit 103, a data processing unit 105 and an error correction decoder 106.

From the transmitting side, a control channel and a data channel are input to the receiver 100. The first demodulation unit 101 demodulates the control channel, and the format obtaining unit 102 obtains an encoding format from the control channel. For example, the information of the encoding rate and the modulation method is obtained. The indexation method determining unit 103 determines the indexation method based on the obtained encoding format.

For example, when the encoding rate R=⅓ and the modulation method QPSK are obtained by the format obtaining unit 102, the indexation method determining unit 103 selects the conventional indexation method obtaining a value near the coefficient value "0.75" and the indexation method by a "minimal error indexation method" described below. And, in case of the encoding rate R=⅘ and the modulation method "16QAM", the indexation method determining unit 103 selects the "indexation method" (the exponent field and the mantissa filed are both 1-bit) according to the present example 1 and the indexation method by the "minimum error indexation method". For example, a table is provided in the memory of the indexation method determining unit 103 and the indexation method can be read to be selected by the encoding rate and the modulation method. The selected information is output to the error correction decoder 106.

The second demodulation unit 104 demodulates the data channel by a predetermined modulation method (16QAM, QPSK or the like). The data processing unit 105 processes the demodulated data to obtain data to be decoded and outputs the data to the error correction decoder 106. Wherein the process can include descrambling or the like when the transmitter applies scrambling of data to transmit the data through the radio path.

Figure 1:
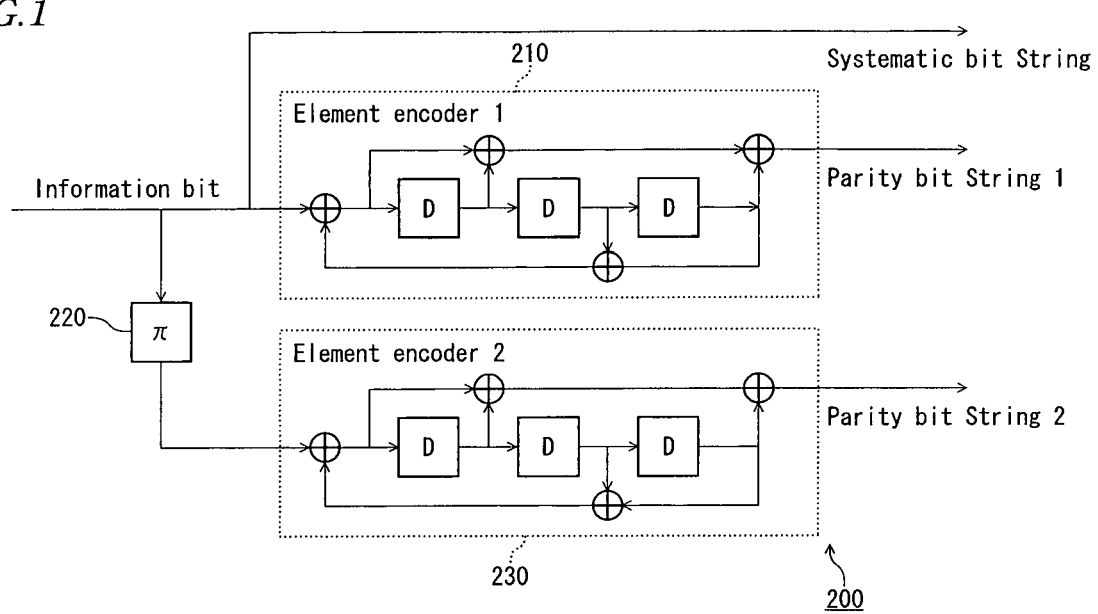
FIG. 1 is a diagram showing a configuration example of a turbo encoder.
Figure 24:
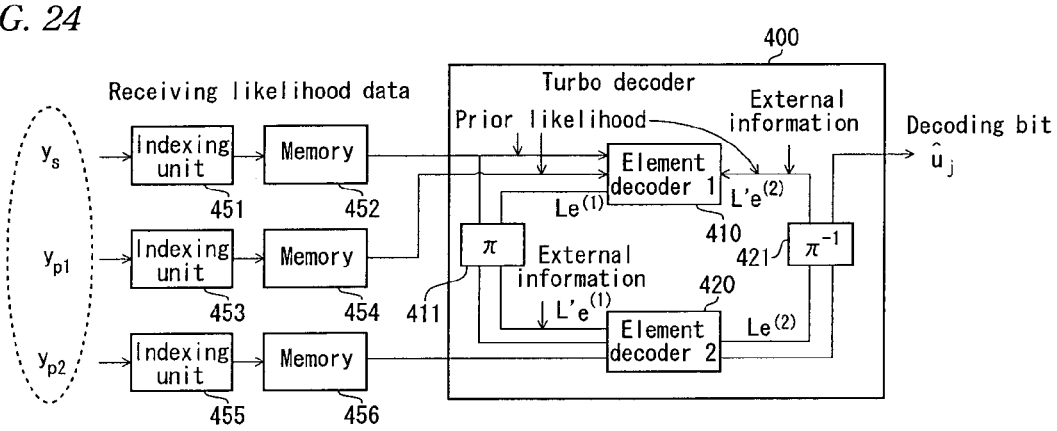
FIG. 24 is a diagram showing a configuration example of a surrounding part of a turbo decoder.

The error correcting decoder 106 includes the turbo decoder 400, shown in FIG. 24, having the element decoders 410 and 420 shown in FIG. 1 and FIG. 2, and the turbo decoder 400 having the element decoders 410 and 420 shown in FIG. 7 and the like. In the error correcting decoder 106, any of the turbo decoders 400 is performed and decoded based on the selected information.

In this way in the present example 4, it is possible to select the appropriate method of error correcting decoding based on the encoding rate and the modulation method.

Example 5

Figure 15:
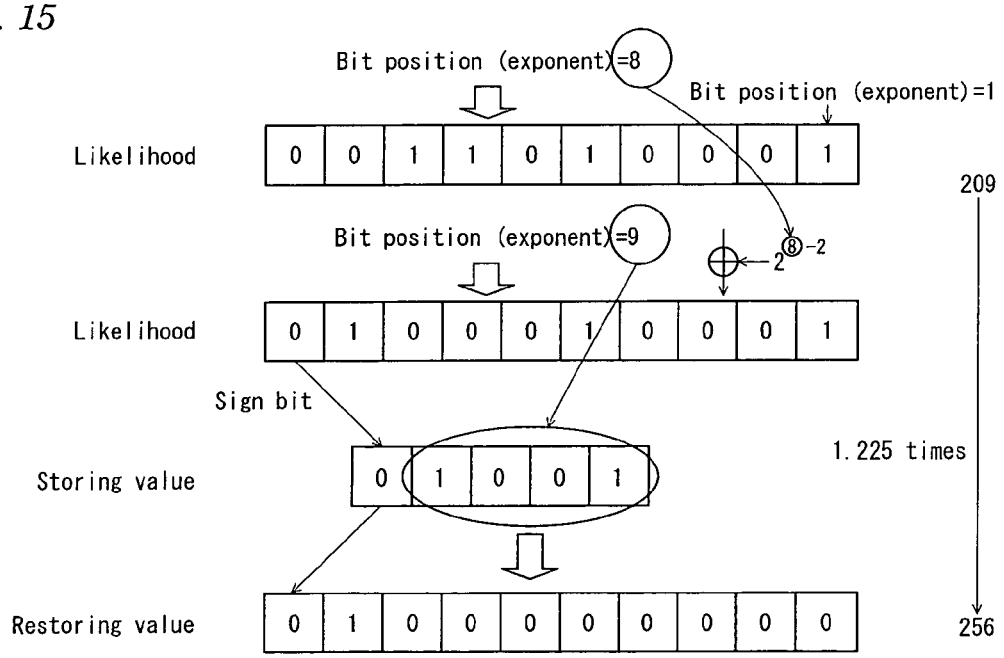
FIG. 15 is a diagram illustrating an example of processing.
Figure 16:
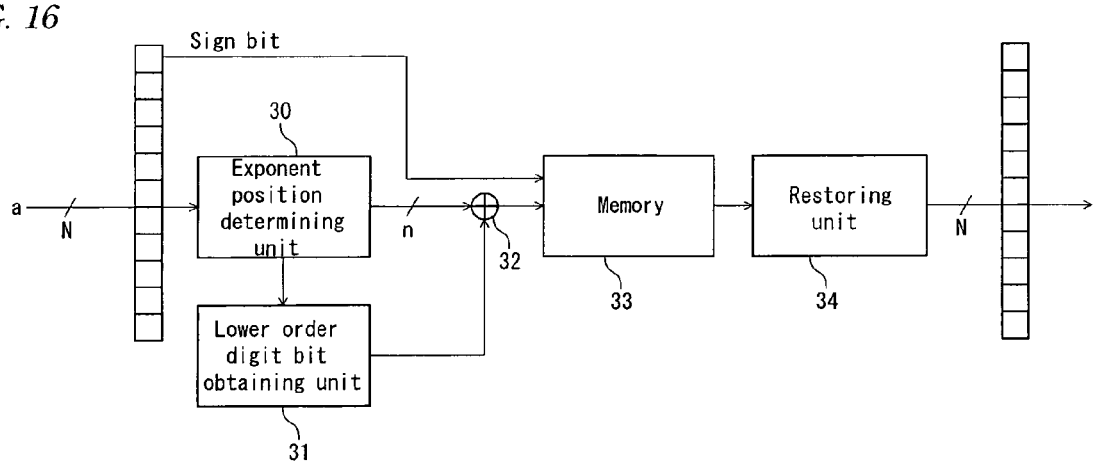
FIG. 16 is a diagram showing another configuration example of an external information processing unit.
Figure 17A:
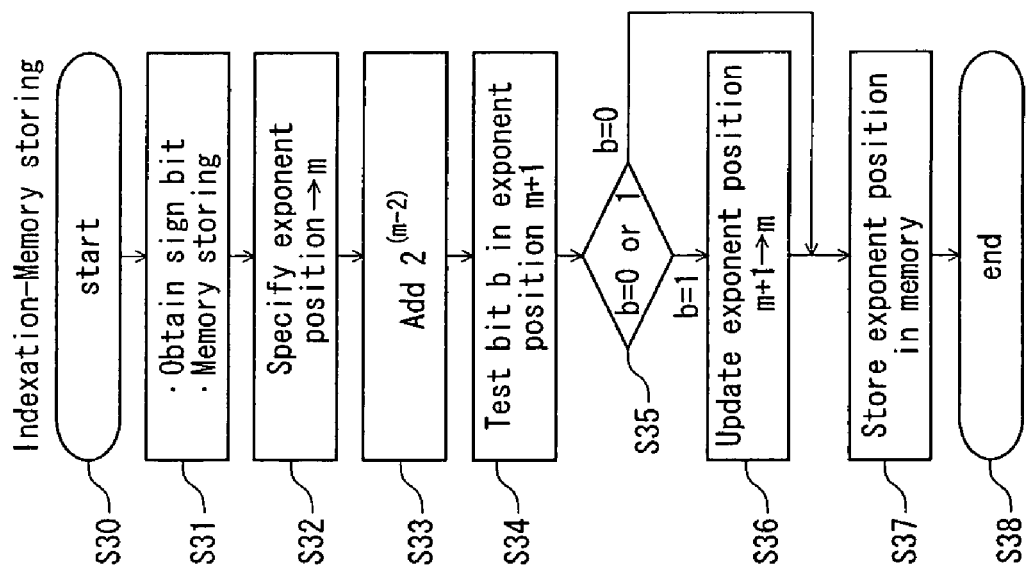
FIG. 17A is a flow chart of memory storing processing and FIG. 17B is a flow chart of memory reading processing.
Figure 17B:
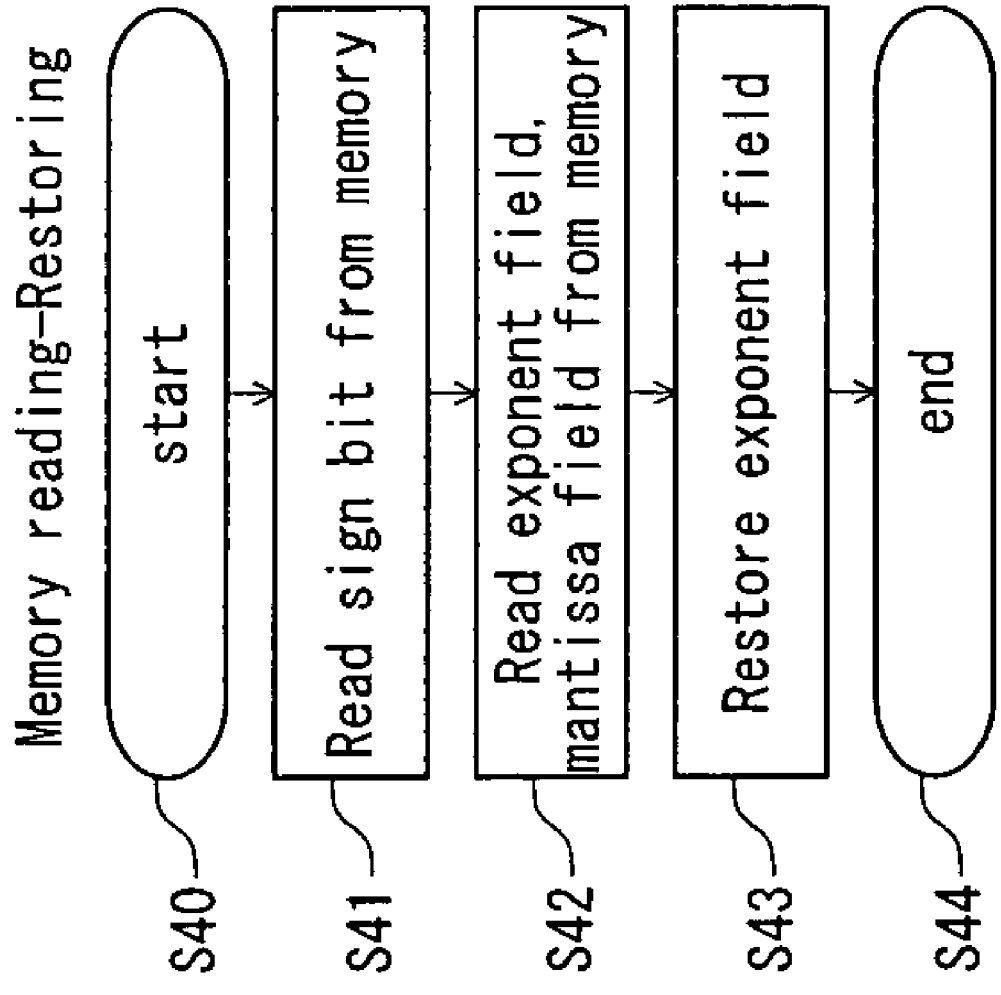

Next, a present example 5 is explained. FIG. 15 is a diagram illustrating an example of the processing according to the present example 5. FIG. 16 is a diagram showing a configuration example of the external information processing unit 10 (FIG. 1). FIG. 17 (A) and FIG. 17 (B) are diagrams showing an example of the flow charts, respectively.

First, an example of the processing is explained by using FIG. 15. Hereinafter, the indexation method of the present example is referred to as a "minimum error indexation method".

As the example of the external information, "209" (decimal number) is input to the external information processing unit 10. As well as in example 1, the position of the exponent is first obtained. In the example of FIG. 15, the exponent is "8". In the present example 5, for the remaining bit (broken number) on the right side of the exponent, which was conventionally discarded across the board, "rounding off" is performed in order to obtain a higher-accuracy exponent. In example 1, the bit is stored in the memory as the mantissa to be restored. However, the bit is "rounded off" in the present example 5.

In order to achieve the "rounding off" of the obtained exponent, a bit in one lower order digit is first obtained. That is, for the obtained exponent m, 2^(m□2) is obtained as the lower order digit. This lower order digit corresponds to "0.5" in a decimal number. Then, this lower order digit 2 (m□2) is added to the external information excluding the sign bit. In the example of FIG. 15, 2^(8−2)=26 (=001000000□ is added to "011010001". The exponent after adding becomes "9" (decimal number). Then, the memory 33 stores the value corresponding to "9" in the memory. A restoring unit 34 restores the external information by reading this value. At this time, as well as in example 1, the mantissa field can be stored in the memory storage unit 33 to be restored. The accuracy of the approximation can be further improved.

The restoring value is "256" (decimal number), and the rate of the input to the output is "1.225" times. As well as in example 1, there storing value is particularly effective for decoding data with a high encoding rate.

FIG. 16 is a diagram showing a configuration example of the external information processing unit 10. The external information processing unit 10 includes an exponent position determining unit 30, a lower digit bit obtaining unit 31, an adding unit 32, a memory 33 and a restoring unit 34.

The exponent position determining unit 30 determines the exponent position of the input external information, and outputs the value to the adding unit 32.

The lower digit bit obtaining unit 31 obtains the digit which is one digit lower than the exponent position, and outputs the value of the digit (001000000) to the adding unit 32.

The adding unit 32 adds the exponent to the digit which is one digit lower than the exponent, and outputs the added exponent (0100010001) to the memory storage unit 33.

The memory storage unit 33 stores the exponent after adding and the sign bit of the input external information in the memory. The sign bit can be obtained by the exponent position determining unit 30.

The restoring unit 34 restores the external information by reading the sign bit and the exponent position. The restored external information is output to the element encoders 420 and 410 for the further decoding process.

FIG. 17 (A) and FIG. 17 (B) are examples of flow charts showing the operation of the processing. Briefly explaining, when the present processing is started (Step 30), the sign bit is obtained for the external information and is stored in the memory 33 (Step 31).

Next, the exponent position m is specified in the exponent position determining unit 30 (Step 32), and "2^(m−2)" is added in the adding unit 32 (Step 33).

Then, a value b in the position of (m−1) bit after adding is checked the adding unit 32 (Step 34). That is, when the bit b is "1", the exponent position is (m−1) because the digit is carried to one higher digit ((b=1) in Step 35, Step 36).

On the other hand, when the bit b is "0" ((b=0) in Step 35), carrying does not occur just like discarding by the "rounding off" does not occur. The obtained exponent position is regarded as m as it is.

Then, the adding unit 32 stores the exponent position in the memory 33 (Step 37), and the storing process in the memory is finished (Step 38).

If the memory reading processing is started (Step 40), in the restoring unit 34, the sign bit and the value of the exponent field (the mantissa field, if it exists) are read from the memory storage unit 33 (Step 41, Step 42), and the external information is restored (Step 43). Then, the processing is finished (Step 44).

In this way in the present example 5, since what is stored in the memory 33 is also the exponent, the number of bits can be reduced as compared with the case where the external information of N-bits itself is stored, so that the amount of the memory can be reduced. Further, in the present example 5, it is possible to obtain the exponent whose accuracy is higher than that of the conventional technology because the "rounding off" of the exponent is performed.

Example 6

Figure 18:
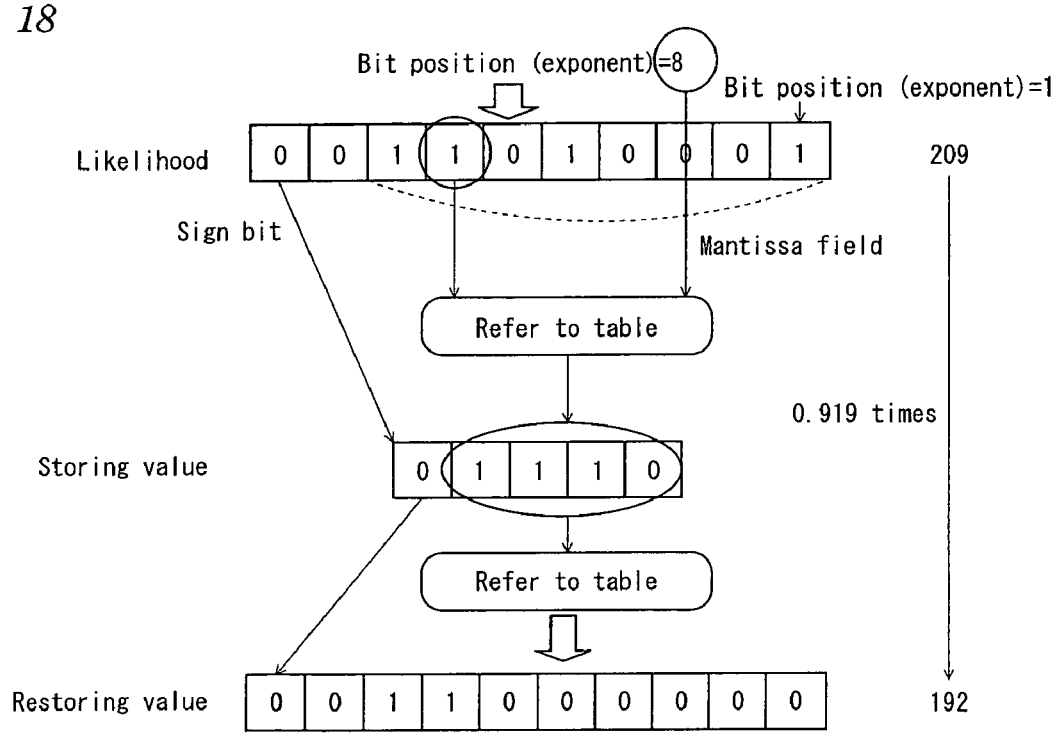
FIG. 18 is a diagram illustrating an example of processing.
Figure 19:
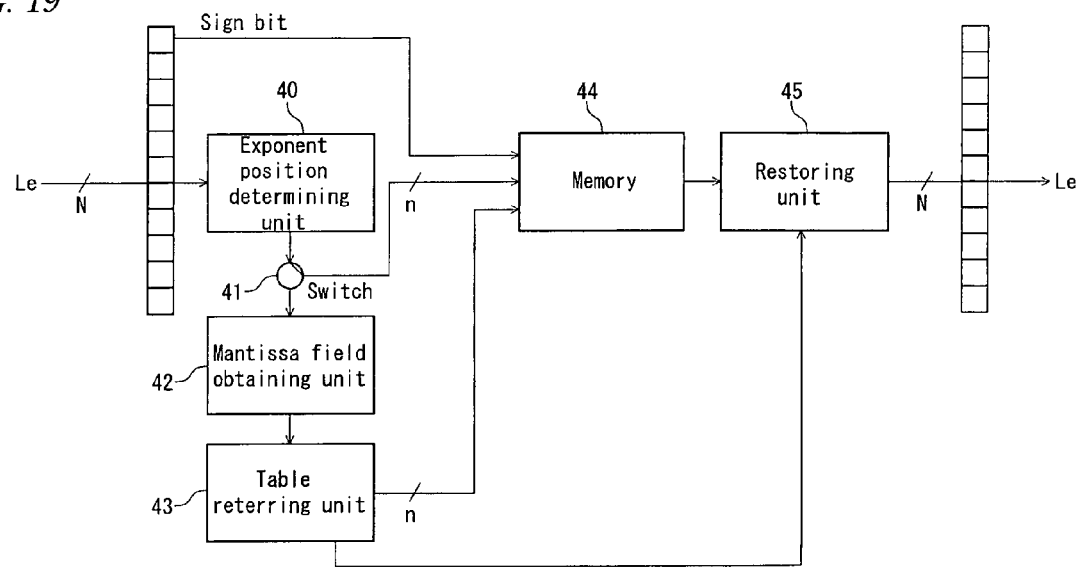
FIG. 19 is a diagram showing another configuration example of an external information processing unit.

Next, an example 6 is explained. FIG. 18 is a diagram illustrating the processing according to the present example 6. FIG. 19 is a configuration example of the external information processing unit 10 according to the present example 6. FIG. 20 and FIG. 21 are examples of tables, and FIG. 22 (A), FIG. 22 (B), FIG. 23 (A) and FIG. 23 (B) are diagrams showing examples of the flow charts, respectively.

First, the processing of the present example 6 is explained with reference to FIG. 18. As well as in example 1 and the like, "209" (decimal number) is input as the example of the external information to the external information processing unit 10. The exponent position "8" is first obtained.

Next, the value of the bit in the position on the right side of the exponent position (the position of the 7th bit) is obtained. In the example of FIG. 18, the exponent is "1". The table is referred to for this exponent position and the value of the bit next to the exponent position, "0011000000". The exponent "14" is obtained by referring the table shown in FIG. 20. The value expressing the exponent value as a binary number ("1110") is stored in the memory together with the sign bit.

At the time of restoring, the group obtaining the exponent "14" is again read from the table reference unit 43, and is obtained as the restoring value ("0011000000").

In the above-described example 5, n (=4) bit is stored in the memory storage unit 33 for the external information of N (=10) bit. The memory storage unit 33 can store sixteen kinds of values because the amount of the memory 33 is 4-bit. However, there are ten kinds of exponents from "0" to "9" which are actually used, and the exponents from "10" to "15" are not stored.

In general, if the number of bit of original data is "N", the number of bit n storing the exponent is n=[log 2 (N)], and the numeric value from "0" to "2^n−1" (□N□1) can be stored in the memory. Due to this, if □N□ 1 □□□2^n−1□ for positive and negative, respectively, the information is not assigned to the numeric value of number of k=2^n−N. In example 5, if N=10 and n=4, the numeric value of the number of k=6 has an "empty" state.

Thus, in the present example 6, the value "1" in the mantissa filed which is the bit next to the exponent field is added in order to assign some numeric values which can not be expressed by indexation. In the table reference unit 43 shown in FIG. 20, numeric values are newly assigned for the exponents from "10" to "15".

As described above, the exponent is the bit position where the bit different from the sign bit first appears in searching it from the left side digit to right side digit. In the example of the table 431 shown in FIG. 20, the exponent "4" is expressed as "0000001000", a bit string in which "1" first appears in the position of the 4th bit. On the other hand, as explained in example 1, the mantissa field of 1-bit is the value of the bit in the digit which is one digit lower than the exponent position. By providing the numeric value including this mantissa field in the table 431, it is possible to achieve the configuration of the method for adding 1-bit to the mantissa field, which is the same as the method of example 1. If the bit which is one digit lower than the exponent "4" is "0", that is, if the mantissa field is "0" (the value is "0000001000"), the exponent "4" is stored in the memory as it is with reference to the table 431. If the bit which is one digit lower than the exponent "4" is "1", that is, if the mantissa field is "1" (the value is "0000001100"), the exponent "10" is stored in the memory with reference to the table 431.

In the example of FIG. 18, a binary value corresponding to the exponent "14" is stored in the memory. Then, in the restoring unit, a numeric value corresponding to the exponent "14" is again read from the table 431 by the table reference unit 43 in order to obtain the restoring value "192" (decimal number), In this case, the rate of the output "192" to the input "209" is "0.919" times, and the storing value which becomes effective by the high encoding rate which is the same as that of example 1 is obtained. Without increasing bit number, it is possible to configure the circuit which is the same as that of the method for adding 1-bit to the exponent field according to example 1.

What is actually stored in a ROM or the like as the table 431 may be the exponent only from "10" to "15" of the table 431. This is because, as for the other value, the external information can be restored by storing the value itself of the exponent in the memory and reading the value.

As shown in FIG. 19, the external information processing unit 10 according to the present example 6 includes an exponent position determining unit 40, a switch 41, a mantissa field obtaining unit 42, a table reference unit 43, a memory 44 and a restoring unit 45.

The exponent position determining unit 40 determines an exponent position of the external information. The switch 41 switches whether the exponent position is stored in the memory 44 (if the value of the mantissa field is "0") or the exponent position is output to the mantissa field obtaining unit 42 (if the mantissa field is "1"), depending on whether the value of the 1-bit mantissa field is "0" or "1".

The mantissa field obtaining unit 42 obtains only 1-bit of the value of the mantissa field for the input external information.

The table 431 stores the exponents from "10" to "15" and corresponding numeric values of the table 431 shown in FIG. 20. For example, the mantissa field obtaining unit 42 obtains the exponent by the obtained exponent and the value of the mantissa with reference to the table 431. The obtained exponent is stored in the memory 44.

The restoring unit 45 restores the external information by reading the sign bit and the exponent from the memory 44. The restored external information is output to the element decoders 420 or 410 for further decoding process.

FIG. 21 is an example of a table 432 to which the other value is assigned. The exponent is assigned to the table 432 in order of greater numeric value. This is because that it is possible to reduce the error of the external information to be restored if the exponent is assigned in order of numeric value of greater digit instead of smaller digit.

For example, it is possible to reduce an average error if more exponents are assigned to the numeric vales from "100" to "1000" instead of the numeric values from "1" to "10". In this example as well, the configuration of the external information processing unit 10 can be same as that of the example of FIG. 20.

Figure 22A:
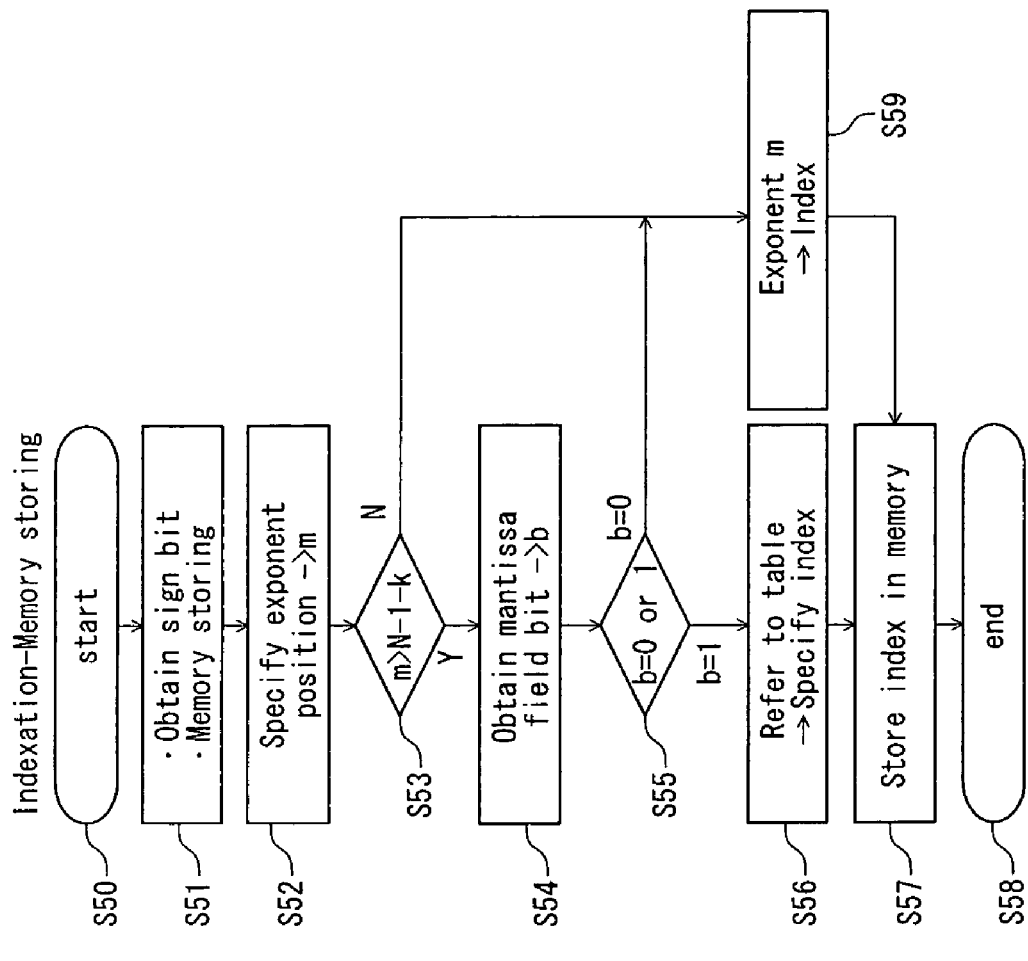
FIG. 22A is a flow chart of memory storing processing and FIG. 22B is a flow chart of memory reading processing.
Figure 22B:
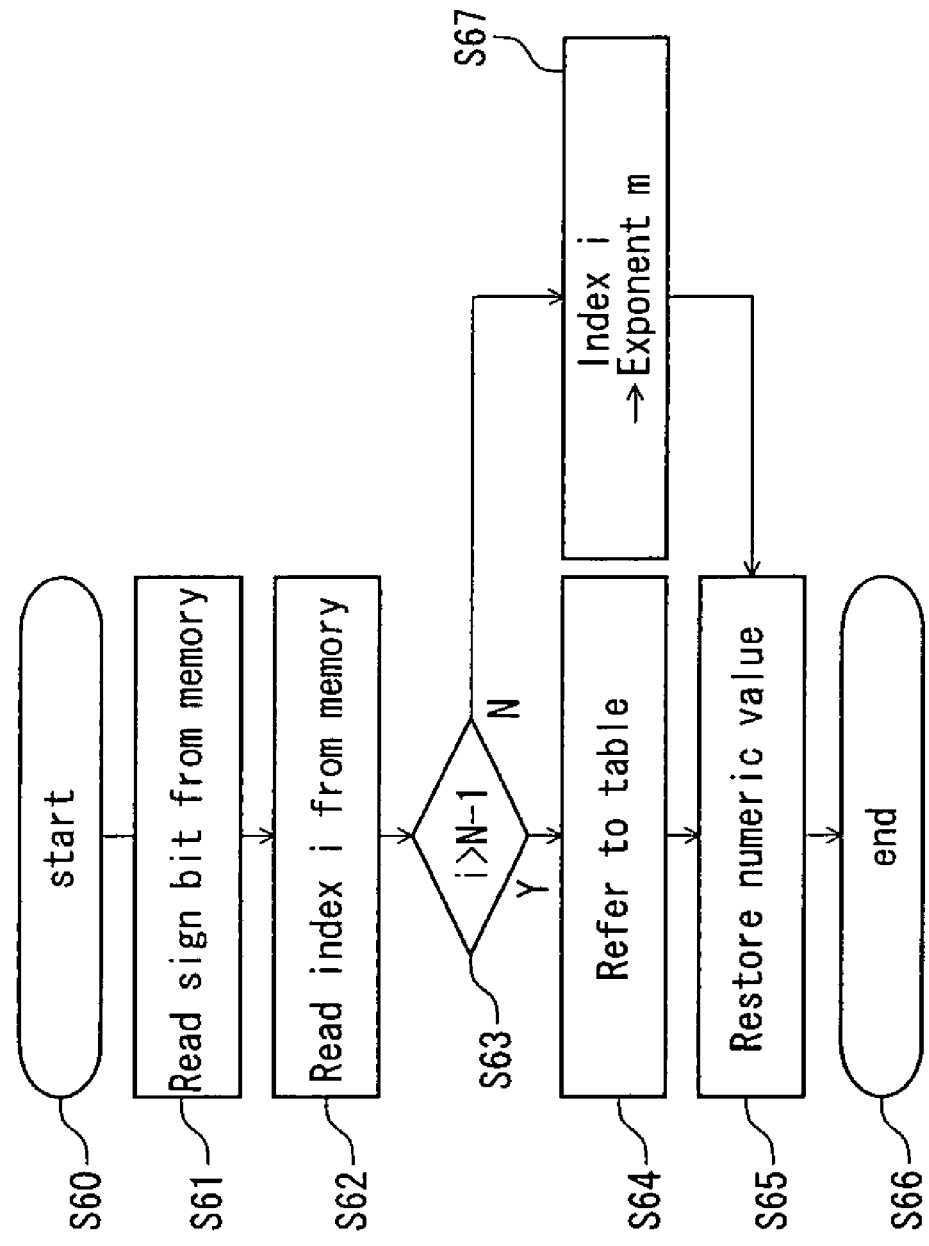

FIG. 22 (A) and FIG. 22 (B) are an example of the flowcharts according to the present example 6. In this case, the example uses the table 431 (FIG. 20).

If the memory storing processing is started (Step 50), the sign bit is obtained in the exponent position determining unit 40 and is stored in the memory 44 (Step 51).

Next, the exponent position m is specified in the exponent position determining unit 40 (Step 52). Then, it is determined whether or not the exponent position m is greater than (N□1□k) (N is the bit number of the external information to be input, and k is the number of numeric value ("6" in the example of FIG. 20) assigned to the table 432) (Step 53).

For the bit number N of the input external information, there is a possibility of the value of the exponent "N□1". Of these values, since the number of k of the value is assigned, a bit greater than (N□1□k) bit is assigned as the empty state. As compared to the exponent m, if the exponent m is greater than the numeric value, the exponent greater than "10" of the table 432 can be referred. That is, the present processing determines whether or not the numeric value greater than "10" which is stored in the table 432 is referred.

Therefore, if the exponent m is greater than the value (N□1□k□ (Yes in Step 53), the mantissa field obtaining unit 42 obtains the mantissa bit b (Step 54). Then, in the mantissa field obtaining unit 42, if the obtained mantissa field is "1" (b=1), an index (a value of the "exponent" in the table 431) is obtained with reference to the table 432 (Step 56). Then, the index is stored in the memory 44.

On the other hand, if the mantissa field is "0" (b=0 in Step 55), the exponent m is stored as the index in the memory 44 as it is (Step 57).

Also, if the exponent position m is smaller than the value (N□1□k) (No in Step 53), the obtained exponent m is stored as the index in the memory 44 as it is (Step 59, Step 57).

Then, the sequence of the memory storing processing is finished (Step 58).

In the memory reading processing, if the present processing is started (Step 60), the sign bit is read from the memory 44 in the restoring unit 45 (Step 61). Then, an index i is read from the memory 44.

Next, the restoring unit 45 determines whether or not the index i is greater than (N□1) (Step 63). That is, in the example of FIG. 20, since the value having the exponent which is greater than "9" is stored in the table 432, it is determined whether or not there is a need to refer to the table 432.

Therefore, if the index i is greater than (N□1) (Yes in Step 63), the restoring unit 45 refers to the table 431 shown in FIG. 20 (Step 64) restores the numeric value (Step 65), and finishes the processing (Step 66).

On the other hand, if the index i is smaller than (N□1) (No in Step 63), the restoring unit 45 does not have to refer to the table 431. The index i is regarded as the exponent as it is (Step 67), and the numeric value is restored (Step 65).

Figure 23A:
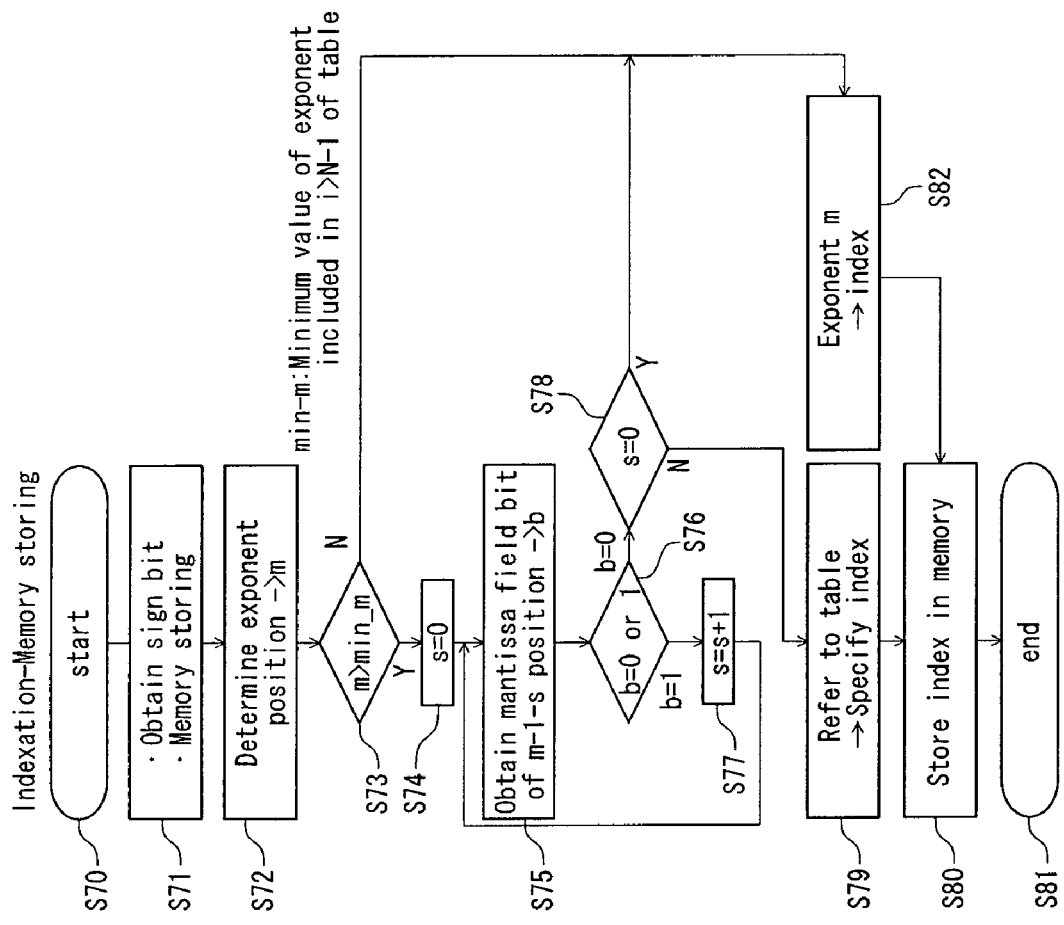

FIG. 23 (A) and FIG. 23 (B) are an example of the flow charts when the table 432 shown in FIG. 21 is used. The explanation of the processing which is the same as that of FIG. 22 (A) is omitted.

If the exponent position m is specified (Step 72), the exponent position determining unit 40 determines whether or not the exponent m is greater than the value (min□m) (Step 73).

At this time, the value (min□m) shows the minimum value of the exponents included in (□□□N□1□) of the table 432. In the example of FIG. 21, of the numeric value greater than the exponent "10", from "0110000000" to "0111100000", the exponent position "7" of the numeric value "0001100000" which is assigned as the exponent "13" becomes the minimum value (min□m) of the exponent. It is determined whether or not to refer to the table 432 shown in FIG. 21 by comparing the minimum value and the obtained exponent. The exponents from "10" to "15" are stored in the table 432 as well as in the example of FIG. 22 (A).

If the exponent m is greater than the value (min□m) (Yes in Step 73), the table reference unit 43 assigns "0" to a value s and obtains the mantissa bit bin the position (m□1□s). Since the value s is "0", the position (m□1), that is, the value of bit on the right side of the exponent m, is obtained as the mantissa.

Next, if the obtained mantissa field b is "1" ((b=1) in Step 76), in order to determine whether or not there is an appropriate numeric value by referring again to the table 432, the value s is incremented by "1" (Step 77), and the process returns to Step 75.

On the other hand, if the obtained mantissa is "0" (No in Step 76), the value which is to be referred in the table 432 is specified. Thus, the table reference unit 43 determines whether or not the value s is "0". If the value s is not "0" (No in Step 78), the index (the value of the exponent) is specified with reference to the table 432 (Step 79). Then, the table reference unit 43 stores the index in the memory 44 (Step 80), and the sequence of the memory storing processing is finished (Step 81).

On the other hand, if the value s is "0" (Yes in Step 78), there is no need to refer to the table 432 and the obtained exponent can be stored as it is to be restored. Thus, the obtained exponent is regarded as the index (Step 82) and is stored in the memory 44 (Step 80).

If the exponent m is smaller than the value (min☐m) (No in Step 73), no value which is to be referred in the table 432 is stored, so that the obtained exponent is stored in the memory 44 as the index (Step 82, Step 80).

In the reading processing of the memory 44, it is determined whether or not there is a need to refer to the table 432 by the index i which is read from the memory 44 (Step 93). If there is a need (Yes in Step 93), the table 432 is referred to restore the numeric value (Step 94, Step 95). If there is no need, the index i is regarded as the exponent m as it is and the numeric value is restored (Step 97, Step 95). The example of the flow chart is the same as that of FIG. 22 (B).

In this way in the present example 6, not only the exponent values from "0" to "9" are assigned for the 4-bit memory 44, but also the exponent values (indexes) are assigned for six numeric values having the empty state. Therefore, it is possible to avoid a waste of the memory 44.

In the above-described example, the case of the mantissa "1" bit or "2" bit for the exponent "1" bit was explained. However, the mantissa field can be "3" bit, "4" bit or the like.

Example 7

Next, an example 7 is explained. FIG. 24 is a diagram showing a configuration example of the surrounding part of the turbo decoder 400 according to the present example 8. The configuration of the turbo decoder 400 is the same as that of example 1. In the present example 7, a previous stage of the turbo decoder 400 includes indexing units 451, 453, 455 and memories 452, 454, 456. By providing the indexing units 451, 453, 455 in the previous stage of the turbo decoder 400, amounts of the memories 452, 454, 456 can be reduced.

As for an indexing method of the indexing units 451, 453, 455, method for adding the mantissa field shown in example 1 and the "minimum error indexing method" shown in example 5 are applicable. Further, the indexing method of example 6 is also applicable. In either case, the accuracy of approximation can be improved. Also, it is possible to allow for reducing the amount of the memory by using the simple indexing method such as conventional technique.

Example 8

In the above-described examples 1 to 7, the examples of the turbo encoding and the turbo decoding were explained. The decoder decoding a LDPC code is also applicable to obtain similar effect. By the LDPC code, the encoder includes a encoder combined with the element decoders 210, 220 and the interleaver 220 (see FIG. 25). The decoder includes a MAP decoder (Sum-Product computing unit). The output from the MAP decoder is returned as external likelihood to the MAP decoder for next decoding process. The decoding processing is also performed by iteration base decoding.

In examples 1 to 7, a systematic bit string is encoded and 2 parity bit strings are obtained. However, encoding to obtain one or 3 parity bit strings also can be applied. For example, for the systematic bit of 1-bit, parity bits of 1-bit or 3-bit can be applicable. And also, the encoding can be performed in a way that three or four of the element decoders 410, 420 are added to decode such encoding data. Further, the encoding also can be performed for all data of the parity bit strings without the systematic bit string in the same way.

The turbo decoder 400 according to those examples is preferred to be applied to, for example, a mobile phone in a mobile communication systematic, an information mobile terminal such as a PDA and the like, or a wireless base station.

According to example explained above, it is possible to provide the decoder and the decoding method preventing degradation of the error rate characteristic. Also, the memory size can be prevented from becoming larger. It is also possible to provide the decoder or the like avoiding a waste in the memory. And, it is possible to provide the decoder or the like preventing degradation of the error rate characteristic caused by approximation.

What is claimed is:

1. A decoder device having an element decoding unit generating external information for input data, comprising:
    an exponent position determining unit, when the external information output from the element decoding unit is input, of information excluding a sign bit from the external information, specifying an exponent that is a bit position where a value different from the sign bit first appears;
    a mantissa obtaining unit obtaining information of 1-bit or a plurality of bits in a position next to the exponent as a mantissa out of the external information; a storage unit storing the exponent and the mantissa; and
    a restoring unit restoring the external information by reading the exponent and the mantissa stored in the storage unit; wherein the element decoding unit performs iteration decoding based on the restored external information.

2. The decoder device according to the claim 1, wherein the restoring unit restores the external information by adding information of the exponent as it is to a bit position next to the bit position corresponding to the exponent.

3. The decoder device according to claim 1, wherein the restoring unit restores the external information by setting a value different from the sign bit in the bit position corresponding to the exponent and adding the information of the mantissa as it is to the bit position next to the bit position corresponding to the exponent.

4. A decoder device having an element decoding unit generating external information for input data, comprising:
    an exponent position determining unit, when the external information output from the element decoding unit is input, specifying an exponent that is a bit position where a value different from a sign bit first appears out of the information excluding the sign bit from the external information;
    an adding unit obtaining a bit of lower digit than the exponent of the external information and adding the external information excluding the obtained bit of lower digit and the sign bit to output added value;
    a storage unit storing said exponent for the added value from the adding unit; and
    a restoring unit restoring the external information by reading the exponent stored in the storage unit, wherein the element decoding unit performs iteration decoding based on the restored external information.

5. The decoder device according to claim 4, wherein the restoring unit restores the external information by setting the value different from the sign bit in the bit position of the exponent for the added value.

6. A decoder device having an element decoding unit generating external information for input data, comprising:
a coefficient scaling unit multiplying the external information output from the element decoding unit by a coefficient value for outputting multiplied result;
an indexing unit specifying, for the multiplied result output from the coefficient scaling unit, an exponent that is a bit position where a value different from a sign bit first appears in accordance with the multiplied result excluding the sign bit;
a storage unit storing the exponent; and
a restoring unit restoring the external information by reading the exponent stored in the storage unit, wherein the element decoding unit performs iteration decoding based on the restored external information.

7. A decoder device having an element decoding unit generating external information for input data, comprising:
a right-shift unit right-shifting m-bit (m is an integer number greater than or equal to 1) of the external information output from the element decoding unit;
a memory to store the right-shifted external information; and
a coefficient scaling unit multiplying the external information that is read from the memory by a coefficient value, wherein the element decoding unit performs iteration decoding based on the external information from the coefficient scaling unit.

8. The decoder device according to claim 7, wherein for the external information that is read from the memory, the coefficient scaling unit multiplies the coefficient value, by a left-shifting unit left-shifting n-bits (n is a integer number greater or equal to 1) of the external information that is read from the memory and an adding unit adding the external information that is read from the memory to external information from the left-shifting unit.

9. A decoder device having an element decoding unit generating external information for input data, comprising:
an exponent position determining unit, when the external information output from the element decoding unit is input, specifying an exponent that is a bit position where a value different from a sign bit first appears out of the information excluding the sign bit from the external information;
a mantissa obtaining unit obtaining information of 1-bit or a plurality of bits in a position next to the exponent of the external information as a mantissa;
a table reference unit obtaining an index corresponding to a combination of the exponent and the mantissa from a table in which indexes are assigned to binary values that can not be expressed as a binary value corresponding to the exponent;
a storage unit storing the obtained index; and
a restoring unit restoring the external information with reference to the table based on the index stored in the storage unit, wherein the element decoding unit performs iteration decoding based on the external information from the coefficient scaling unit.

10. The decoder device according to claim 9, wherein the indexes are assigned to the table in order of lowest digit of the other binary values.

11. The decoder device according to claim 9, wherein the indexes are assigned to the table in order that more indexes are assigned to higher-order digit than to lower-order digit of the other binary values.

12. A decoder device having an element decoding unit generating external information for input data having bit strings, comprising:
an indexing unit specifying an exponent, for each of the bit strings, that is a bit position where a value different from a sign bit, out of information excluding the sign bit, respectively on an input side of the element; and
a memory to store each of the exponent output from the indexing unit, respectively, wherein the element decoding unit performs iteration decoding based on the bit string of the input data that is read from memory.

13. A decoding method of a decoder device having an element decoding unit generating external information for input data, comprising: the external information output from the element decoding unit is input, out of the information excluding the sign bit from the external information, specifying an exponent that is a bit position where a value different from a sign bit first appears, obtaining information of 1-bit or a plurality of bits in a position next to the exponent of the external information as a mantissa, storing the exponent and the mantissa in the memory unit, and restoring the external information by reading the exponent and the mantissa stored in the memory unit, wherein the element decoding unit performs iteration decoding based on the restored external information.

14. A decoding method of a decoder device having an element decoding unit generating external information for input data, comprising: the external information output from the element decoding unit is input, out of the information excluding the sign bit from the external information, specifying an exponent that is a bit position where a value different from a sign bit first appears, obtaining information of 1-bit or a plurality of bits in a position next to the exponent of the external information as a mantissa, storing the exponent and the mantissa in the memory unit, and restoring the external information by reading the exponent and the mantissa stored in the memory unit, wherein the element decoding unit performs iteration decoding based on the restored external information.

15. A decoding method of a decoder device having an element decoding unit generating external information for input data, comprising: multiplying the external information output from the element decoding unit by a coefficient value, out of the information excluding the sign bit from the multiplied external information, specifying an exponent that is a bit position where a value different from a sign bit first appears in the multiplied external information, storing the exponent in a memory unit, and restoring the external information by reading the exponent stored in the memory unit, wherein the element decoding unit performs iteration decoding based on the restored external information.

16. A decoding method of a decoder device having an element decoding unit generating external information for input data, comprising: right-shifting by m-bits (m is an integer number greater than or equal to 1) the external information output from the element decoding unit, storing the m-bit right-shifted external information in a memory unit, and multiplying the external information that is read from the memory unit by a coefficient value, wherein the element decoding unit performs iteration decoding based on the restored external information.

17. A decoding method of a decoder device having an element decoding unit generating external information for input data, comprising: out of the external information excluding a sign bit from the external information, specifying an exponent that is a bit position where a value different from the sign bit first appears, obtaining information of 1-bit or a plurality of bits in a position next to the exponent of the external information as a mantissa, from a table to which indexes are assigned to binary values that can not be expressed as the binary values corresponding to the exponent, obtaining a index corresponding to a combination of the exponent and the mantissa, and storing the obtained index in a memory; and restoring the external information with reference to the table based on the index, wherein the element decoding unit performs iteration decoding based on the restored external information.

18. A decoder device comprising:
- an element decoding unit to generate external information for input data, and to perform iteration decoding of the external information;
- an indexing unit to specify, out of information excluding a sign bit from the external information, an exponent that is a bit position where a value different from the sign bit first appears, the exponent being specified by an indexation method of a plurality of indexation methods, and the exponent being used for the iteration decoding;
- a format information obtaining unit to obtain format information related to at least one of a decoding rate and a modulation method for the input data; and
- an error correction decoding unit to decode the input data by an error correction method which is selected from a plurality of error correction methods, the error correction method using the iteration decoding, and the error correction method being selected to use the indexation method in accordance with the format information.

19. The decoder device according to claim 18, further comprising:
- a mantissa obtaining unit to obtain information of 1-bit or a plurality of bits in a position next to the exponent as a mantissa out of the external information, wherein
- the plurality of indexation methods includes an indexation method which specifies the exponent and the mantissa to be used for the iteration decoding.

* * * * *